United States Patent [19]
Saiuchi et al.

[11] Patent Number: 5,486,941
[45] Date of Patent: Jan. 23, 1996

[54] FINE SPHERE, A SPHERICAL SPACER FOR A LIQUID CRYSTAL DISPLAY ELEMENT AND A LIQUID DISPLAY ELEMENT USING THE SAME

[75] Inventors: Kazuo Saiuchi, Otsu; Minoru Kohara, Otokuni; Kunikazu Yamada, Kurita; Kazuhiko Kanki, Uji, all of Japan

[73] Assignee: Sekisui Fine Chemical Co., Ltd., Osaka, Japan

[21] Appl. No.: 859,408

[22] PCT Filed: Sep. 27, 1991

[86] PCT No.: PCT/JP91/01285

§ 371 Date: May 28, 1992

§ 102(e) Date: May 28, 1992

[87] PCT Pub. No.: WO92/06402

PCT Pub. Date: Apr. 16, 1992

[30] Foreign Application Priority Data

| Sep. 29, 1990 | [JP] | Japan | 2-261728 |
| May 9, 1991 | [JP] | Japan | 3-104298 |
| May 9, 1991 | [JP] | Japan | 3-104299 |
| May 9, 1991 | [JP] | Japan | 3-104300 |

[51] Int. Cl.$^6$ ............ G02F 1/1339; G02F 1/1345; G09F 9/35
[52] U.S. Cl. ............ 359/81; 359/88; 428/407
[58] Field of Search ............ 359/81, 88, 80; 428/1, 407; 430/20; 427/195, 213.33, 218, 221; 439/66, 86, 91

[56] References Cited

U.S. PATENT DOCUMENTS

| 4,640,584 | 2/1987 | Tsubakimoto et al. | 359/81 |
| 4,685,770 | 9/1987 | Baeger | 359/81 |
| 5,130,831 | 7/1992 | Kohara et al. | 359/81 |
| 5,142,395 | 8/1992 | Yamazaki et al. | 359/81 |

FOREIGN PATENT DOCUMENTS 51-22453  2/1976  Japan.
57-189117  11/1982  Japan.

(List continued on next page.)

OTHER PUBLICATIONS

Patent Abstracts of Japan, vol. 13, No. 511, P961, abstract of JP 01-207719, publ. 1989–Aug. 21 Toray Ind Inc.
Patent Abstracts of Japan, vol. 10, No. 57, P434, abstract of JP 60-200228, publ 1985–Oct. 09 Nippon Shokubai Kaguku Kogyo K.K.
Patent Abstracts of Japan, vol. 13, No. 499, P957, abstracts of JP 01-200227, publ 1989–Aug. 11 Japan Synthetic Rubber Co Ltd.
Patent Abstracts of Japan, vol. 11, No. 261, P609, abstract of JP 62-66228, publ 1987–Mar. 25 Seiko Epson Corp.
Saiuchi, *Extra Series No. 8, Full–Color Liquid Crystal Display Technique*, pp. 129–137, Published by K. K. Torikeppsu (Japanese Phonetic) Chapter 2, "Spacer Improvement,", Feb. 1990.

*Primary Examiner*—William L. Sikes
*Assistant Examiner*—Tai V. Duong
*Attorney, Agent, or Firm*—Morrison & Foerster

[57] ABSTRACT

A spherical spacer is provided for defining a gap dimension between substrates of a liquid crystal display. The K-value (hardness of a sphere) of the spherical spacer is defined as:

$$K = (3/\sqrt{2}) \cdot F \cdot S^{-3/2} \cdot R^{-1/2}$$

(wherein F and S represent a load value (kgf) and a compression displacement (mm) at 10% compression deformation of said fine sphere, respectively, and R represents a radius (mm) of said fine sphere) which is in the range of 250 kgf/mm$^2$ to 700 kgf/mm$^2$ at 20° C.; and a recovery factor after the compression deformation which is in the range of 30% to 80% at 20° C. A spherical spacer matching the newly found limitations and defining the gap between a pair of substrates into which liquid crystal is filled reduces the damage to an alignment coat when compared with spacers being too hard, and reduces quality deterioration of the image when compared with spacers being too soft.

14 Claims, 4 Drawing Sheets

FOREIGN PATENT DOCUMENTS

| | | |
|---|---|---|
| 59-28185 | 2/1984 | Japan . |
| 60-200228 | 10/1985 | Japan . |
| 61-83520 | 4/1986 | Japan . |
| 62-185749 | 8/1987 | Japan . |
| 63-44631 | 2/1988 | Japan . |
| 63-89890 | 4/1988 | Japan . |
| 63-89408 | 4/1988 | Japan . |
| 63-73225 | 4/1988 | Japan . |
| 63-94224 | 4/1988 | Japan . |
| 63-200126 | 8/1988 | Japan . |
| 63-275688 | 11/1988 | Japan . |
| 64-59974 | 3/1989 | Japan . |
| 1-144429 | 6/1989 | Japan . |
| 1-144021 | 6/1989 | Japan . |
| 1-207719 | 8/1989 | Japan . |
| 1-200227 | 8/1989 | Japan . |
| 1-225776 | 9/1989 | Japan . |
| 1-247154 | 10/1989 | Japan . |
| 1-293316 | 11/1989 | Japan . |
| 2-214781 | 8/1990 | Japan . |
| 2-261537 | 10/1990 | Japan . |
| 8704556 | 7/1987 | WIPO . |

FINE SPHERE, A SPHERICAL SPACER FOR A LIQUID CRYSTAL DISPLAY ELEMENT AND A LIQUID DISPLAY ELEMENT USING THE SAME

TECHNICAL FIELD

The present invention relates to a fine sphere used as a spherical spacer for a liquid crystal display element, a conductive fine sphere and the like. More particularly, it relates to a spherical spacer for a liquid crystal display element, a liquid crystal display element using same, and a conductive fine sphere.

BACKGROUND ART

FIG. 7 shows a typical liquid crystal display element of a TN (twisted nematic) mode using conventional spacers.

This liquid crystal display element comprises a pair of substrates 37, 39, spacers 38 disposed between the pair of substrates 37, 39 so as to maintain a constant cell gap therebeween, a nematic liquid crystal 41, a sealing material 30 filled in the periphery of the cell gap between the pair of substrates 37, 39, and polarizing sheets 42, 43 coated on the surfaces of the respective substrates 37, 39.

The above-mentioned substrates 37, 39 are formed by patterning transparent electrodes 32, 35 made of ITO (Indium-Tin-Oxide) films on one surface of respective transparent substrates 31, 34 made of glass and by coating the surfaces of the transparent electrodes 32, 35 and the transparent substrates 31, 34 with alignment coat (polyimide films). The alignment coat 33, 36 are provided with alignment control by rubbing.

The spacers 38 are made from inorganic materials including aluminum oxide, silicon dioxide and the like, or synthetic resin materials including benzoguanamine, polystyrene type polymer and the like. The spacers made from inorganic materials are disclosed, for example, in Japanese Laid-Open Paten Publication Nos. 63-73225 and 1-59974, and the spacers made from synthetic resin materials are disclosed in Japanese Laid-Open Patent Publication Nos. 60-200228 and 1-293316.

The liquid crystal display element with the above-mentioned structure is usually produced as follows.

The spacers 38 are dispersed on the alignment coat 33 of the substrate 37, and resin for sealing is coated on the periphery of the substrate 37 by printing. Then, the pair of substrates 37, 39 are superimposed so that the alignment coat 33, 36 are faced to each other and pressed. The resin for sealing is hardened by heating to form a sealed material, thereby fixing the pair of substrates 37, 39 to each other. The nematic liquid crystal 41 is filled in the space between the pair of substrates 37, 39 through a hole provided in the sealing material, and after that, the hole is closed. Then, the polarizing sheets 42, 43 are layered on the outside surfaces of the transparent substrate 31, 34.

As spacers used for the above-mentioned liquid crystal display element, colored spherical spacers are often used for the following reasons.

In the liquid crystal display element, the liquid crystal is optically changed to form an image by applying a voltage between the transparent electrodes. However, spacers are not optically changed by the application of a voltage. Therefore, uncolored spacers are likely to be observed as white spots in dark portions of a displayed image, resulting in a decrease in the contrast of the image display.

Colored spherical spacers made from inorganic materials are disclosed in Japanese Laid-Open Patent Publication Nos. 62-66228, 63-89408, and 63-89890. Colored spherical spacers made from synthetic resin materials are disclosed in Japanese Laid-Open Patent Publication Nos. 1-200227, 1-207719 and 2-214781.

Moreover, the spacers having no adhesion are not fixed to the transparent substrates, giving rise to the following disadvantages. Therefore, the adhesive coated spherical spacers are often used.

1) Air blown onto or air suction from the substrates in the process of assembling the liquid crystal display cell may cause scattering of spacers disposed on the substrates, resulting in loss of the spacers.
2) The spacers may be displaced on the surfaces of the substrates in the process of injecting liquid crystal into the liquid crystal display cell, resulting in bias of the spacer arrangement on the substrates.
3) The spacers may be displaced by the electrical or hydrodynamic forces arising while the liquid crystal display cell is in operation.
4) The spacers may be displaced when mechanical vibration acts on the liquid crystal display cell from outside.

These displacements of the spacers in the liquid crystal display cell decrease the cell gap precision and remarkably deteriorate the image quality.

Adhesive spherical spacers are disclosed, for example, in Japanese Laid-Open Utility Model Publication No. 51-22453, Japanese Laid-Open Patent Publication Nos. 63-44631, 63-94224, 63-200126, 1-247154, 1-247155 and 2-251537.

However, when the spacers made from conventional inorganic materials or spacers made from the synthetic resin materials are used as spacers for the liquid crystal display element, the following disadvantages arise.

As shown in FIG. 8, when the liquid crystal display element is produced by using the inorganic spacers 38, the spacers 38 are so hard that they damage the alignment coat 33 when both substrates 37, 39 are pressed. On a damaged portion 33a of the alignment coat 33, a desired molecule arrangement of the liquid crystal 41 cannot be maintained. For example, in the transmission type liquid crystal display element, the damaged portion 33a appears as a display defect.

Furthermore, the inorganic spacers 38 are hard to be deformed, so that the spacers 38 come into contact with the inner surfaces of the substrates 37, 39 at one point, respectively. As a result, the spacers 38 are likely to be displaced in the space including the liquid crystal 41 due to gravity or minute vibration. This disadvantage often appears in a large liquid crystal display element used for lap-top type personal computers or word processors, wall-mounting TV sets, etc. which have rapidly come into wide use in recent years, since the display surface is used in the vertical direction or the inclined direction. For example, most of the spacers 38 move downward in the liquid crystal display element, causing nonuniformity in the thickness of the liquid crystal layer and making it difficult to provide a clear image. Also, the movement of the spacers 38 damage the alignment coat 33, causing the above-mentioned display defect.

On the other hand, when spacers which are too soft are used, the following disadvantages arise.

It is impossible to uniformly disperse the spacers 38 on the surfaces of the substrates 37, 39, and considerable irregularity is caused in the dispersion density. When the pair of substrates 37, 39 are pressed while facing each other, the pressure applied on one spacer 38 in the small dispersion density area is large, so that the spacer 38 is largely deformed. In contrast, the pressure applied on one spacer 38 in the large dispersion density area is small, so that the spacer 38 is hardly deformed. In this way, as shown in FIG. 9, the irregularity of the dispersion density of the spacers 38 causes nonuniformity in the thickness of the liquid crystal layer disposed between the pair of the substrates 37, 39. As a result, a clear image cannot be obtained.

Moreover, when the pair of substrates 37, 39 are pressed, it is actually impossible to apply uniform pressure onto the entire substrates 37, 39, and the substrates 37, 39 are applied with different pressures at different portions thereof. Accordingly, when the spacers 38 which are too soft are used, the respective spacers 38 are deformed to different degrees because of the difference of pressure with which the spacers 38 are subjected, resulting in the nonuniformity of thickness of the liquid crystal layer. As a result, the image quality is remarkably deteriorated.

On the other hand, in the field of electronics mounting, metal particles such as Au, Ag and Ni are mixed with a binder resin to prepare conductive paste, and this paste is filled between a pair of fine electrodes, whereby the pair of fine electrodes are connected to each other. However, such metal particles are nonuniform in shape and have a larger specific gravity compared with the binder resin, so that it is difficult to disperse those metal particles in the binder resin.

In order to overcome those disadvantages, Japanese Laid-Open Patent Publication No. 59-28185 discloses that the surfaces of particles such as glass beads, silica beads, and glass fibers, the particle sizes of which are relatively uniform, are plated with metal to form conductive fine spheres. However, the conductive fine, spheres disclosed in the above have core fine spheres which are too hard, and they are difficult to be deformed by compressing. Because of this, when the electrodes are connected to each other by using the above-mentioned conductive fine spheres, the contact areas between the conductive fine spheres and the surfaces of the electrodes are not spread, making it difficult to reduce contact resistance.

Japanese Laid-Open Patent Publication Nos. 62-185749 and 1-225776 discloses conductive fine spheres using polyphenylenesulfide particles, phenol resin particles and the like as core fine spheres. However, the conductive fine spheres using such synthetic resin particles as core fine spheres do not have sufficient recoverability after being deformed by compressing. Because of this, when the electrodes are connected to each other by using these conductive fine spheres and the compression lead acting on both electrodes is removed, non-contacting state is formed between the conductive fine spheres and the surfaces of the electrodes, resulting in imperfect contacts.

DISCLOSURE OF INVENTION

A fine sphere of the present invention, which overcomes the above-discussed and numerous other disadvantages and deficiencies of the prior art, has a K-value defined as $K=(3/\sqrt{2}) \cdot F \cdot S^{-3/2} \cdot R^{-1/2}$ (wherein F and S represent a load value (kgf) and a compression displacement (mm) at 10% compression deformation of the fine sphere, respectively, and R represents a radius (mm) of the fine sphere) in the range of 250 kgf/mm$^2$ to 700 kgf/mm$^2$ at 20° C., and has a recovery factor after the compression deformation in the range of 30% to 80% at 20° C.

In a preferred embodiment, the K-value is in the range of 350 kgf/mm$^2$ to 550 kgf/mm$^2$.

In a preferred embodiment, the recovery factor after the compression deformation is in the range of 40% to 70% at 20° C.

In a preferred embodiment, the fine sphere is at least one selected from the group consisting of polydivinylbenzene, divinylbenzene-styrene copolymer, divinylbenzene-acrylate copolymers, and polydiallylphthalate.

In a preferred embodiment, the fine sphere is in a spherical shape, and its diameter is in the range of 0.1 to 100 μm.

In a preferred embodiment, the diameter of the fine sphere is in the range of 0.5 to 50 μm.

In a preferred embodiment, the diameter of the fine sphere is in the range of 1.0 to 20 μm.

A spherical spacer for a liquid crystal display element of the present invention has a K-value defined as $K=(3/\sqrt{2}) \cdot F \cdot S^{-3/2} \cdot R^{-1/2}$ (wherein F and S represent a load value (kgf) and a compression displacement (mm) at 10% compression deformation of spherical spacer, respectively, and R represents a radius (mm) of the spherical spacer) in the range of 250 kgf/mm$^2$ to 700 kgf/mm$^2$ at 20° C., and has a recovery factor after the compression deformation in the range of 30% to 80% at 20° C.

A colored spherical spacer for a liquid crystal display element of the present invention comprises a colored core fine sphere, having a K-value defined as $K=(3/\sqrt{2}) \cdot F \cdot S^{-3/2} \cdot R^{-1/2}$ (wherein F and S represent a load value (kgf) and a compression displacement (mm) at 10% compression deformation of the colored spherical spacer, respectively, and R represents a radius (mm) of the colored spherical spacer) in the range of 250 kgf/mm$^2$ to 700 kgf/mm$^2$ at 20° C., and a recovery factor after the compression deformation in the range of 30% to 80% at 20° C.

An adhesive coated spherical spacer for a liquid crystal display element of the present invention comprises a core fine sphere and an adhesive layer formed on a surface of the core fine sphere, having a K-value defined as $K=(3/\sqrt{2}) \cdot F \cdot S^{-3/2} \cdot R^{-1/2}$ (wherein F and S represent a load value (kgf) and a compression displacement (mm) at 10% compression deformation of the adhesive coated spherical spacer, respectively, and R represents a radius (mm) of the adhesive coated spherical spacer) in the range of 250 kgf/mm$^2$ to 700 kgf/mm$^2$ at 20° C., and has a recovery factor after the compression deformation in the range of 30% to 80% at 20° C.

A liquid crystal display element of the present invention is produced by using the above-mentioned respective spherical spacers.

A conductive fine sphere of the present invention comprises the above-mentioned fine sphere and a conductive layer formed on a surface of the fine sphere.

In a preferred embodiment, the conductive layer is an indium-plated layer.

Thus, the invention described herein makes possible the objectives of: (1) providing spherical spacers which neither change the alignment property of the liquid crystal by damaging the alignment coat of the liquid crystal display element nor deteriorate the image quality; (2) providing spherical spacers which do not cause irregularity in the cell gap to decrease clearness of the image (3) providing spherical spacers which are not displaced due to gravity and minute vibration and a liquid crystal display element using same; (4) providing a liquid crystal display element which has no image defect and provides a clear image (5) providing conductive fine spheres having appropriate compression deformability and recoverability from deforming and (6)

providing conductive fine spheres excellent in connection reliability.

BRIEF DESCRIPTION OF THE DRAWINGS

This invention may be better understood and its numerous objects and advantages will become apparent to those s skilled in the art by reference to the accompanying drawings as follows.

BEST MODE FOR CARRYING OUT THE INVENTION

Figure 1:
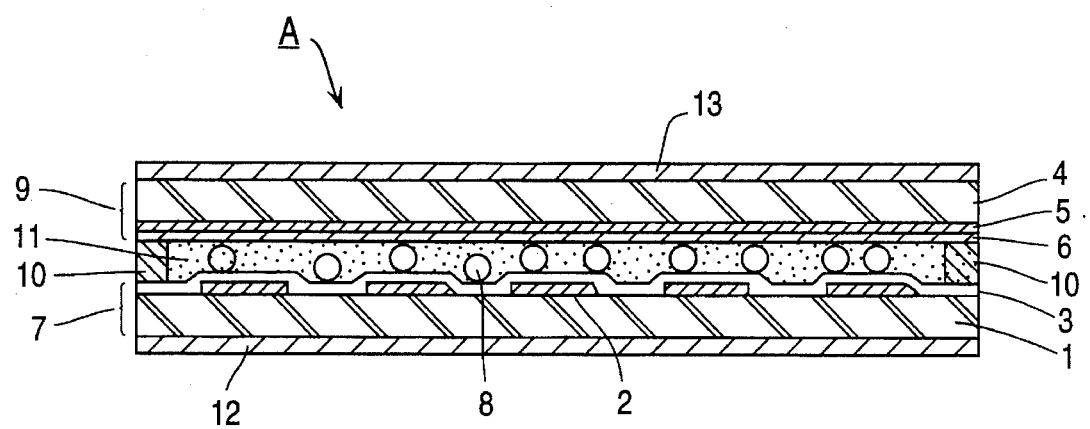
FIG. 1 is a cross-sectional view showing an example of a liquid crystal display element according to the present invention.

I. Fine spheres, spherical spacers for a liquid crystal display element, colored spherical spacers for a liquid crystal display element, and adhesive coated spherical spacers for a liquid crystal display element.

Fine spheres of the present invention have a K-value in a predetermined range and a recovery factor after the compression deformation in a predetermined range. The fine spheres can be used as spherical spacers for a liquid crystal display element.

Also, colored spherical spacers for a liquid crystal display element have a K-value in a predetermined range and a recovery factor after the compression deformation in a predetermined range. Adhesive spherical spacers for a liquid crystal display element have a K-value in a predetermined range and a recovery factor after the compression deformation in a predetermined range and exhibit adhesion when heated.

The K-value will be described.

According to The Course of Theoretical Physics by Landau-Lifshitz, "Theory of elasticity" p. 42 (published by Tokyo Tosho in 1972), when two elastic spheres each having radius R and R' are in contact with each other by compression, h is given by the following equations.

$$h = F^{2/3}[D^2(1/R + 1/R')]^{1/3} \quad (1)$$

$$D = (3/4)[(1-\sigma^2)/E + (1-\sigma'^2)/E'] \quad (2)$$

wherein h represents a difference between the distance between the centers of both spheres and R+R', F represents compressive force, E and E' respectively represent elastic moduli of both spheres, σ, σ' represent Poisson's ratios of the elastic spheres.

On the other hand, when the spheres are placed on rigid plates and compressed from both sides, suppose R'→∞, E>>E', the following equation is approximately obtained.

$$F = (2^{1/2}/3)(S^{3/2})(E \cdot R^{1/2})(1-\sigma^2) \quad (3)$$

wherein S represents an amount of compression deformation. The following equation can be obtained by modifying the above equation (3). K-value is defined as follows.

$$K = \frac{E}{1 - \sigma^2} \quad (4)$$

Thus, the following equation can be obtained.

$$K = (3/\sqrt{2}) \cdot F \cdot S^{-3/2} \cdot R^{-1/2} \quad (5)$$

This K-value universally and quantitatively represents hardness of the spheres. The preferable hardness of the fine spheres or spacers (hereinafter, referred to as spacers and the like) can be quantitatively and unequivocally represented by using this K-value.

The K-value at 10% compression deformation is in the range of 250 kgf/mm² to 700 kgf/mm². When a liquid crystal display element is produced by using the spacers and the like in this range, the spacers and the like do not damage the alignment coat. Moreover, when the gap between the electrodes is adjusted by pressing, the gap can be readily controlled. It is more preferable that the K-value at 10% compression deformation is in the range of 350 kgf/mm² to 550 kgf/mm².

When the spacers and the like having a K-value more than 700 kgf/mm² are used, the surfaces of the liquid crystal alignment coat are likely to be damaged in the course of the production of the liquid crystal display element. Moreover, in the liquid crystal display element so produced, the spacers and the like are not likely to be changed by compression due to the contraction of liquid crystal at decreased temperatures, whereby babble is generated under the reduced pressure in the liquid crystal cell.

When the spacers and the like having a K-value less than 250 μkgf/mm² are used, the cell gap control becomes difficult.

The mechanical properties of the material for the preferred spacers and the like cannot be completely shown merely by defining the preferred hardness of the spacers and the like used for the liquid crystal display element.

Another important condition is that the recovery factor after the compression deformation, which is a value representing the elasticity of the spacers and the like, is in a predetermined range. The elasticity and plasticity of the spacers and the like can be quantitatively and unequivocally shown by defining the recovery factor after the compression deformation.

In the spacers and the like of the present invention, the recovery factor of the spacers and the like after the compression deformation is preferably in the range of 30% to 80% at 20° C. A more preferred recovery factor is in the range of 40% to 70%.

When spacers having a recovery factor of more than 80% are used, and the gap between both substrates is adjusted by pressure pressing, followed by the reduction of pressure in the course of the production of the liquid crystal cell, the spacers and the like which are deformed by compression are likely to return to their original shape because of the elasticity thereof, so that the cell gap of the liquid crystal cell obtained is disordered.

When the spacers having a recovery factor of less than 30% are used, and the gap between both substrates is adjusted by pressure pressing, the portion to which excess pressure is applied is not likely to return to the desired cell gap, since the spacers and the like remain deformed by compression. Thus, the cell gap is disordered.

Next, the method for measuring the K-value and the recovery factor after the compression deformation will be described.

(A) Method for measuring the K-value and conditions thereof (i) Method for measurement Spacers and the like are dispersed on a steel sheet having a smooth surface at room temperature, and one of spacers and the like is chosen. Then, the spacers and the like are compressed with a smooth end surface of a circular cylinder made of diamond and having a diameter of 50 μm by using a compression test machine (PCT-200 type Shimadzu Seisekusho Ltd.). At this time, the compression load is electrically detected as electromagnetic force, and the compression displacement is electrically detected as change by using a transformer.

Figure 2:
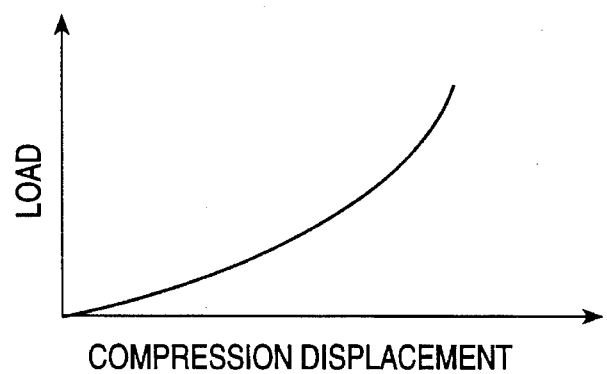
FIG. 2 is a graph showing a relationship between the load and the compression displacement of spacers.
Figure 3:
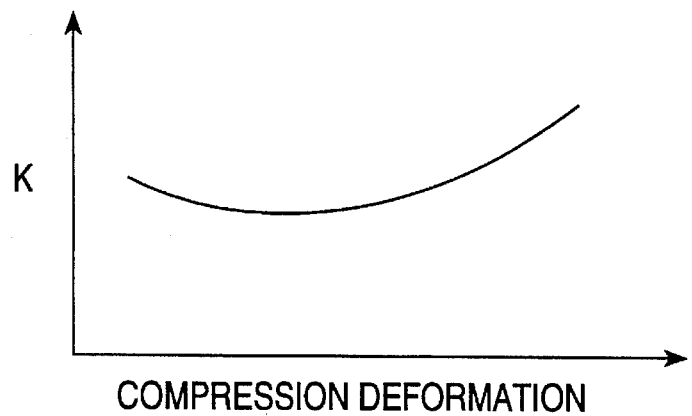
FIG. 3 is a graph showing a relationship between the K-value and the compression deformation of spacers.

The relationship between the compression displacement and the load is obtained as shown in FIG. 2. From FIG. 2, the load value and the compression displacement at 10% compression deformation of the spacers and the like are respectively obtained. From these values and the equation (5), the relationship between the K-value and the compression deformation is obtained as shown in FIG. 3.

Compression distortion (%) is obtained by dividing the compression displacement by a diameter of the spacers and the like.

(ii) Compression speed

The compression is performed under constant load and constant speed. The load is increased at the rate of 0.27 g weight (grf)/sec.

(iii) Test load

The maximum load is 10 grf.

(B) Method for measuring the recovery factor after the compression deformation and conditions thereof (i) Method for measurement Spacers and the like are dispersed on a steel sheet having a smooth surface, and one of spacers and the like is chosen. Then, the spacers and the like are compressed with the smooth end surface of a circular cylinder made of diamond and having a diameter of 50 μm by using a compression test machine (PCT-200 type Shimadzu Seisekusho Ltd.) at 20° C. A this time, the compression load is electrically detected as electromagnetic magnetic force, and the compression displacement is electrically detected by using a differential transformer.

Figure 4:
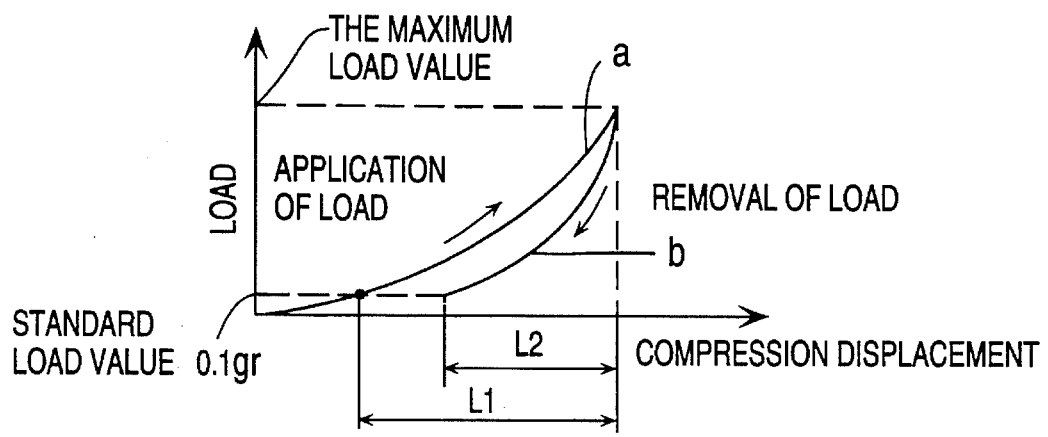
FIG. 4 is a graph illustrating a method for the measurement of the recovery factor after the spacers are deformed by compressing.

As shown in FIG. 4, the spacers and the like are compressed to maximum load value (shown by a curve (a) in FIG. 4), and after that, the load is decreased (shown by a curve (b) in FIG. 4). A this time, the relationship between the load and the compression displacement is measured with proviso that terminal point of reducing the load is not the load value zero but refers to 0.1 g of the standard load value. The recovery factor is defined as the ratio $(L_2/L_1)$ represented by %, wherein $L_1$ is a change until the maximum load point and $L_2$ is a change from the maximum load point to the standard load value.

(ii) Conditions for measurement

The maximum load value: 1 grf

Standard load value: 0.1 grf

Compression speed of application and removal of load: 0.27 grf/sec

Temperature of measuring room: 20° C.

As the spacers and the like of the present invention, inorganic particles or synthetic resin particles can be used as long as they satisfy the above K-value and the recovery factor. In particular, the synthetic resin particles are preferred since the K-value and the recovery factor thereof can be readily adjusted in the above range.

The types of synthetic resins suitable for the formation of the spacers and like include the following various kinds of plastic materials: linear or cross-linked polymers such as polyethylene, polypropylene, polymethylpentene, polyvinylchloride, polytetrafluoroethylene, polystyrene, polymethyl methacrylate, polyethylene terephthalate, polybutylene terephthalate, polyamides, polyimides, polysulfone, polyphenyleneoxide, and polyacetal and resins having a net structure such as epoxy resins, phenol resins, melamine resins, unsaturated polyester resins, polydivinylbenzene; divinylbenzene-styrene copolymer, divinylbenzene-acrylate copolymers, polydiallylphthalate, polymer of triallyl isocyanurate, and polymer of benzoguanamine.

Among the aforesaid resins, those especially desirable for the formation of the spacers are resins having a net structure such as polydivinylbenzene, divinylbenzene-styrene copolymer, divinylbenzeneacrylate copolymers, and polydiallylphthalate.

There is no special limit to inorganic materials and conventional known materials can be used.

Preferred shape of the spacer and the like is spherical. Diameters in the range of 0.1 to 100 μm are preferred, more preferably in the range of 0.5 to 50 μm, and still more specifically in the range of 1 to 20 μm.

The colored spherical spacers for a liquid crystal display element of the present invention are colored. Examples of a method for coloring include staining, pigment mixing, polymerization of dye monomers, and oxidizing a metallic thin film formed on the spacers. The method for coloring is disclosed, for example, in Japanese Laid-Open Patent Publication Nos. 57-189117, 63-89890, 1-144021, 1-144429, 63-66228, 63-89408, 1-200227, 1-207719 and 2-214781. These methods for coloring can be incorporated into the present invention.

The reason for using the colored spherical spacers as spacers for a liquid crystal display element of the present invention is as follows:

In the liquid crystal display element, the liquid crystal is optically changed to form an image by applying a voltage between the transparent electrodes. However, spacers are not optically changed by the application of a voltage. Therefore, uncolored spacers are likely to be observed as luminescent spots in dark portions of a displayed image, resulting in a deterioration in the contrast of the image display.

The adhesive coated spherical spacers for a liquid crystal display element of the present invention have adhesion when being heated. Examples of methods for providing the spacers with adhesion include forming a waxy polyethylene layer, a hot-melt adhesive layer, or an epoxy adhesive layer on the surface of the core fine spheres.

Methods for providing adhesion are disclosed, for example, in Japanese Laid-Open Utility Model Publication No. 51-22453, Japanese Laid-Open Patent Publication Nos. 63-44631, 63-94224, 63-200126, 1-247154, 1-247155 and 2-261537. These methods can be introduced into the present invention.

When the adhesive coated spherical spacers are used as the spacers for a liquid crystal display element, the spacers can be prevented from being displaced in the gap between the substrates. As a result, the alignment coat are prevented from being damaged, and the image quality and the cell gap precision between the substrates are improved.

Core fine particles used for colored spherical spacers and adhesive coated spherical spacers can be formed from the above spacers and the like.

As described above, the spacers and the like of the present invention have a K-value in a predetermined range and a recovery factor after the compression deformation in a predetermined range, so that these spacers have physical properties preferable as the spacers for a liquid crystal display element. That is, since the hardness of these spacers is appropriate, they are not likely to damage the alignment coat when the substrates are applied with pressure in the course of the production of the liquid crystal display element.

Moreover, the spacers have an appropriate deformation property, so that the spacers come into contact with the substrates over a large area. As a result, the spacers are not likely to be placed on the surfaces of the substrates due to gravity and minute vibrations. Furthermore, the alignment coat are prevented from being damaged by the movement of the spacers.

Since the spacers have appropriate hardness, when pressure is applied to the pair of substrates facing each other, the applied pressure is supported by the spacers, whereby the gap between the substrates can be uniformly maintained. Accordingly, irregularity of the thickness of the liquid crystal layer can be reduced compared with the conventional liquid crystal layer.

II. Liquid crystal display element

Figure 7:
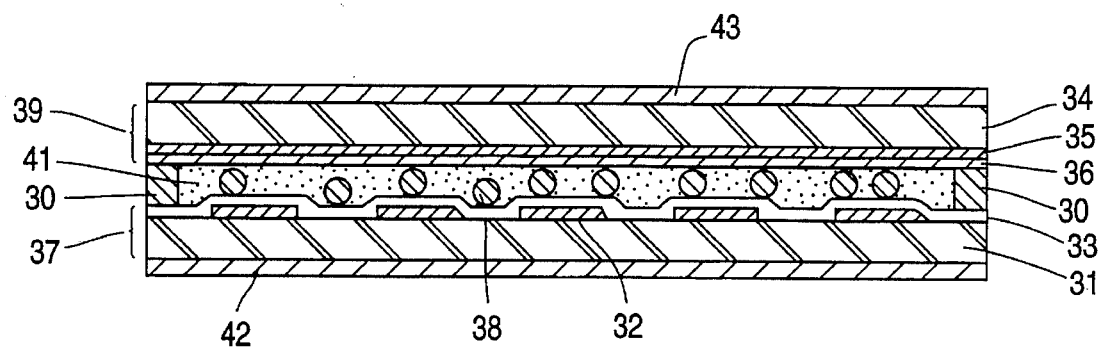
FIG. 7 is a cross-sectional view showing a general liquid crystal display element.
Figure 8:
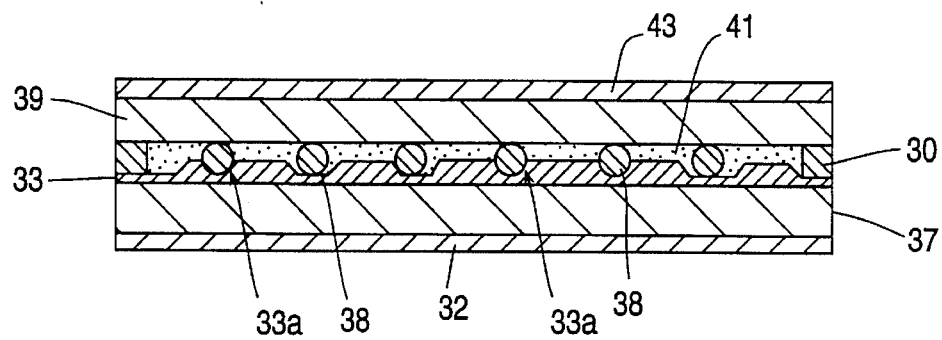
FIG. 8 is a cross-sectional view showing a liquid crystal display element produced by using spherical spacers which are too hard.
Figure 9:
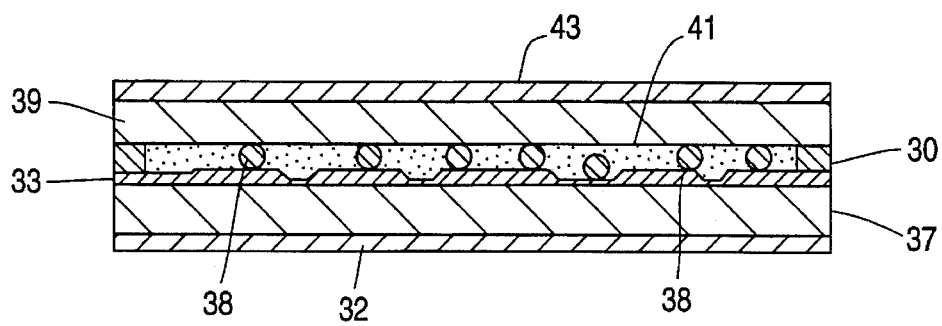
FIG. 9 is a cross-sectional view showing a liquid crystal display element produced by using spherical spacers which are too soft.

Hereinafter, an example of the liquid crystal element of the present invention will be described with reference to the drawings. The liquid crystal display element of the present invention can have the same construction as that shown in FIG. 7 except that the above-mentioned spherical spacers are used.

As shown in FIG. 1, a liquid crystal display element A comprises a pair of substrates 7, 9, spacers 8 disposed between the pair of substrates 7, 9 so as to maintain a constant gap therebetween, nematic liquid crystal 11, a sealing material 10 filled in the periphery of the gap between the pair of substrates 7, 9, and polarizing sheets 12, 13 coated on the surfaces of the respective substrates 7, 9.

The above-mentioned substrates 7, 9 are formed by patterning transparent electrodes 2, 5 made of ITO (Indium-Tin-Oxide) film on one surface of their respective transparent substrates 1, 4 made of glass and by coating the surfaces of the transparent electrodes 2, 5 and the transparent substrates 1, 4 with alignment coat (polyimide films 3, 6). The alignment coat 3, 6 are provided with alignment control by rubbing.

The spacers 8 have a K-value in the above-mentioned predetermined range and a recovery factor after the compression deformation in the above-mentioned predetermined range. The spacers 8 may be colored and/or may have adhesion.

According to the present invention, the liquid crystal display element in which a clear image is obtained without image defects can be provided.

III. Conductive fine spheres

The conductive fine spheres of the present invention have the above-mentioned fine spheres and conductive layers formed on the surfaces of the fine spheres. These conductive fine spheres can be used for the conductive connection between fine electrodes in the field of electronic mounting.

In the conductive fine spheres, as described above, the K-value at 10% compression deformation is in the range of 250 kgf/mm$^2$ to 700 kgf/mm$^2$. When the conductive fine spheres in this range are used, the facing electrode surfaces are not damaged by the conductive fine spheres in the course of the production of the element in which a pair of electrodes are connected by the conductive fine spheres. Moreover, when the gap between the electrodes is adjusted by pressure pressing, the gap control can be readily performed. A more preferred K-value at 10% compression deformation is in the range of 350 kgf/mm$^2$ to 550 kgf/mm$^2$.

When the K-value is more than 700 kgf/mm$^2$, the conductive fine spheres disposed between the two electrodes are not readily deformed by being applied with pressure. As a result, the contact area between the conductive fine spheres and the electrode surfaces does not spread, making it difficult to reduce contact resistance. Moreover, when excess load is applied in order to deform the conductive fine spheres, the conductive layers formed on The surfaces of the conductive fine spheres are torn up or peeled off, damaging The electrode surfaces in the course of the production of the element.

When the conductive fine spheres having a K-value less than 250 kgf/mm$^2$ disposed between two electrodes are applied with a compression load, the compression deformation often becomes great, so that the conductive layers formed on the surfaces of The conductive fine spheres do not follow This deformation. As a result, there is a possibility that the conductive layers are torn up or peeled off. Moreover, when the amount of compression deformation becomes great and the conductive fine spheres flatten, the electrodes come into contact with each other, causing unsatisfactory minute electrode connection.

Furthermore, in the conductive fine spheres of the present invention, the recovery factor after the compression deformation of the conductive fine spheres is in the range of 30% to 80% at 20° C. The range of 40% to 70% is especially preferred.

When adhesive, in which the conductive fine spheres having the recovery factor more than 80% are dispersed, is disposed between two electrodes, these electrodes are contacted to each other by pressing, and the pressure is removed after the adhesive is hardened, the conductive fine spheres after being deformed by compression readily return to their original shape, so that the adhesive layers are likely to be peeled off from the electrode surfaces.

In the element produced by a method, in which adhesive with the conductive fine spheres having the recovery factor less than 30% dispersed therein are filled between two electrodes, these electrodes contact each other by pressing, and the pressure is removed after the adhesive is hardened, the adhesive layers continue to contract and expand under the repetition of cooling and heating. However, the conductive fine spheres remain deformed by compression, so that a gap is generated between the surfaces of the electrodes when the adhesive layers expand, causing contact defects.

The conductive fine spheres of the present invention can be made of inorganic materials or synthetic resins as long as they satisfy the K-value and the recovery factor in the above-mentioned range. As the fine spheres forming these conductive fine spheres, the same kind of spacers and the like as that mentioned above can be used. Examples of preferred resins for forming the fine spheres include resins having a net structure such as polydivinylbenzene, divinylbenzenestyrene copolymer, divinylbenzene-acrylate copolymers, and polydiallylphthalate.

The particle diameter of the fine spheres is in the range of 0.1 to 100 μm, preferably in the range of 0.5 to 50 μm, and more preferably in the range of 1 to 20 μm.

The thickness of the conductive layers is preferably in the range of 0.02 to 5 μm. When the thickness is less than 0.02 μm, it is difficult to obtain the desired conductivity. When the thickness is more than 5 μm, the conductive layers are likely to be peeled off from the surfaces of the fine spheres due to the difference of the thermal expansion coefficient between the fine spheres and the conductive layers.

Examples of metals used for the conductive layers include Ni, Au, Ag, Cu, Co, Sn, In, or alloy including one or more of these metals as its main component. In particular, indium is preferred.

Examples of methods for forming metal layers on the surfaces of the fine spheres include an electroless plating (chemical plating), a coating method in which paste obtained from metal powders alone or metal powders mixed with binders is coated on the fine spheres; and a physical deposition method such as vacuum deposition, ion plating, and ion sputtering.

A method for forming a metal layer by the electroless plating will be described by way of illustrating an example using gold substitution plating.

This method is divided into the following: an etching step, an activation step, a chemical nickel plating step and an gold substitution plating step.

In the etching step, unevenness is formed on the surfaces of the fine spheres so that plated layers adhere to the fine spheres. Examples of etchant include caustic soda aqueous solution, concentrated hydrochloric acid, concentrated sulfuric acid, and chromic anhydride.

In the activation step, catalytic layers are formed on the surfaces of the etched fine spheres, and the catalytic layers are activated. The activation of the catalytic layers promotes the deposition of metallic nickel in the chemical nickel plating step described later. The catalytic layers formed on the surfaces of the fine spheres, including $Pd^{2+}$ and $Sn^{2+}$ are treated with concentrated sulfuric acid or concentrated hydrochloric acid, and $Sn^{2+}$ alone is removed by dissolution, thereby metallizing $Pd^{2+}$. The metallized palladium is activated with a palladium activator such as concentrated caustic soda solution and sensitezed.

In the chemical nickel plating step, metallic nickel layers are further formed on the surfaces of the fine spheres on which the catalytic layers are formed. For example, nickel chloride is reduced with sodium hypophosphite, and nickel is deposited on the surfaces of the fine spheres.

In the gold substitution plating step, the fine spheres coated with nickel are put in gold potassium cyanide aqueous solution, and nickel is eluted under rising temperature, thereby depositing on the surfaces of the fine spheres.

When the conductive layers are formed from indium-plated layers, the thickness of the conductive layers are preferably in the range of 0.02 to 5 μm. When the thickness of the conductive layers is less than 0.02 μm, it is difficult to obtain the desired conductivity. When the thickness of the conductive layers is more than 5 μm, and a pair of electrodes sandwiching conductive fine spheres therebetween are pressed, elasticity of the conductive fine spheres cannot be effectively exhibited. When the thickness of the conductive layers is more than 5 μm, the conductive fine spheres are likely to aggregate.

Examples of methods for forming indium-plated layers on the surfaces of the fine spheres are as follows:

(1) Method for forming indium-plated layers by electroless plating

Thin films made of metal (e.g. Cu) whose ionization tendency is greater Than that of indium are previously formed on the surfaces of the fine spheres, and then this metal is replaced with indium.

$$3Cu^- + 2In^{+++} \rightarrow 3Cu^{++} + 2In\downarrow$$

(2) Method for reduction plating

A reducer is added to an aqueous solution of indium salt and indium is deposited on the surfaces of the fine spheres by a reduction reaction, thereby forming indium-plated layers.

Alternatively, thin films made of metal such as nickel is previously formed on the surfaces of the fine spheres, after which indium is deposited on the surfaces by the reduction reaction, thereby forming indium-plated layers.

(3) Method for forming indium-plated layers by mechanical and physical techniques The fine spheres and indium fine particles are mixed, and then the indium fine particles are collided with or rubbed into the surfaces of the fine spheres by using hybridization on mechanofusion, thereby forming indium thin films on the surfaces of the fine spheres. Alternatively, the fine spheres and the indium fine particles are mixed, and then they are heated to melt the indium, thereby coating the indium thin films on the surfaces of the fine spheres.

Figure 5:
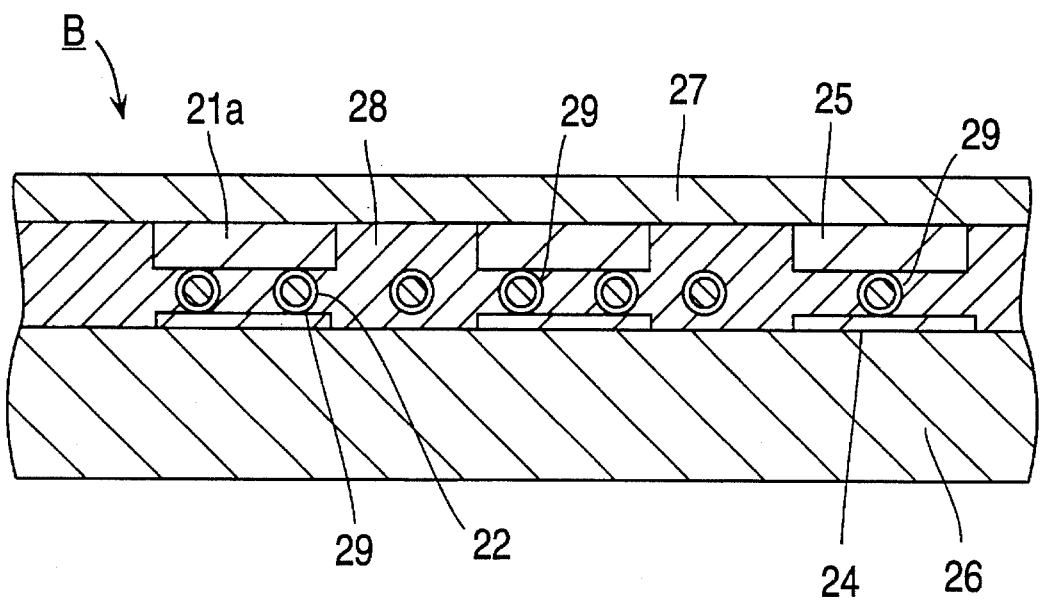
FIG. 5 is a cross-sectional view showing main portions of a liquid crystal display element produced by using conductive fine spheres.

The element can be produced by using conductive fine spheres thus obtained. This element can be produced, for example, as follows:

As shown in FIG. 5, an insulating binder 28 in which conductive fine spheres 29 are uniformly dispersed is coated on electrodes 24 by screen printing or a dispenser, or the conductive fine spheres 29 alone are disposed on the electrodes 24 without using the binder 28. In the case of the latter, the conductive fine spheres 29 can be dispersed from above the electrodes 24 or the conductive fine spheres 29 are charged to be electrostatically attached onto the electrodes 24.

Next, electrodes 25 are superimposed over the above electrodes 24. Under this condition, the electrodes 24 and 25 are applied with pressure. It is not required to apply great pressure. A pressure which maintains the contact condition between the conductive fine spheres 29 and the surfaces of the electrodes 24 and 25 can be applied. Then, a lamination in which the conductive fine spheres 29 are sandwiched between the pair of the electrodes 24 and 25 is heated. Press heating is preferred. As described above, an element B is obtained as shown in FIG. 5.

Examples of electrodes used for the above element include electrodes in which ITO thin films are formed on glass plates, electrodes in which aluminum thin films are formed on glass plates, electrodes produced by attaching Cu sheets on plastic films, followed by etching, and electrodes produced by printing silver paste and carbon black on films. In this way, predetermined portions between the electrodes of a liquid crystal display element can be electrically connected by using the conductive fine spheres.

Since the conductive fine spheres of the present invention can be deformed by compression to an appropriate degree, when the electrodes are connected by using the conductive fine spheres, the contact areas between the conductive fine spheres and the surfaces of the electrodes are enlarged, thereby reducing contact resistance. Moreover, the recoverability from the deformation by the compression of the conductive fine spheres is appropriate. Therefore, when the compression load applied on the electrodes is removed in the course of the connection between the electrodes by using the conductive fine spheres, a gap is not formed between the conductive fine spheres and the surfaces of the electrodes, eliminating contact defects.

As described above, the conductive fine spheres of the present invention have appropriate compression deformation properties and recoverability from deformation, so that when the conductive fine spheres sandwiched between the electrodes are used, they exhibit excellent non-isotropic conductivity and connection reliability. Thus, they are applicable to the following uses.

(1) Transfer materials for electrically connecting upper and lower electrodes in a liquid crystal display element.
(2) Materials for a COG (chip on glass) connection between an LSI and a glass substrate on which electrodes are formed in a liquid crystal display element.
(3) Materials for electrically connecting a glass substrate on which electrodes are formed and a flexible printed circuit in a liquid crystal display element.
(4) Materials for a COB (chip on board) or COF (chip on film) connection between board-shaped or a film-shaped substrate und an LSI.

Examples

Hereinafter, the present invention will be described by way of illustrating examples.

The test method is as follows:
(A) Measurement of mean particle size
This was performed with a Coulter Counter Model ZB/C-1000 particle size measuring apparatus (manufactured by Coulter Electronics Co., Ltd.).
(B) Compression test for spacers
This was performed with a compression test machine (manufactured by Shimadzu Seis a kusho Ltd.).
(C) Measurement of the cell gap between upper and lower substrates of a liquid crystal cell
This was performed with a Liquid Crystal Cell Gap Measurement Apparatus (Trade Name TFM-120 AFT, manufactured by Oak Seisa kusho Ltd.).
(D) Display performance of a liquid crystal display element
A polarizing sheet was applied to both upper and lower surfaces of a liquid crystal cell so that the color tone of light reflected from the liquid crystal cell becomes olive color. Then, the color irregularity in density was observed in the polarizing sheet. Moreover, the liquid crystal display element was connected with a power source to be lit up, and the image obtained was observed.

Example 1

Tetramethylolmethane tetraacrylate was polymerized by suspension polymerization, after which spacers having a mean particle diameter of 7.03 µm (standard deviation 0.27 µm) were selected by the classification.

These spacers were subjected to a compression test. The K-value at 10% compression deformation was 550 µkgf/mm$^2$. Also, in the case of the maximum load value of 1 grf, the recovery factor after the compression deformation was 65%.

A transparent conductive film of the indium oxide-tin oxide type having a thickness of about 500 Å was formed on a glass plate having a thickness of 0.7 mm by the low temperature sputtering method. After that, a predetermined electrode pattern was formed on the glass plate by photolithography. Then, an alignment agent was coated on the glass plate, and an alignment coat was formed by heating. The resulting glass plate was cut into a size of 5 cm× 12.5 cm to obtain a glass substrate for a liquid crystal display element.

An epoxy adhesive in which glass fiber spacers were mixed was printed at the periphery of this glass substrate to a thickness of 1 mm by screen printing.

The glass substrate was horizontally placed, and then the spacers obtained were dispersed from above by pressurized nitrogen gas and were uniformly dropped onto the glass substrate. The dispersion time was adjusted so that the dispersion concentration of the spacers on the glass substrate was about 100 spacers/mm$^2$.

Another glass substrate was superimposed over the above glass substrate on which the spacers were dispersed, and the entire glass substrates sustained a load of 1 kg weight/cm$^2$ uniformly applied by a press machine. At the same time, the glass substrates were heated to 160° C. for 20 minutes to harden the epoxy adhesive at the periphery thereof.

A cell thus produced was evacuated so that the inside thereof became a vacuum, and then liquid crystal was drawn inside through a hole provided in a part of a peripheral sealing portion. The gap between the upper and the lower substrates of the liquid crystal cell thus produced was measured to obtain a cell gap value in the range of 6.98±0.03 µm.

A polarizing sheet was applied to the upper and the lower surfaces of this liquid crystal cell so hat the color tone of light reflected from the liquid crystal cell became olive color. This olive color was even with no irregularity in density. Moreover, the liquid crystal display element was connected with a power source to be lit up, and a satisfactory display performance was observed.

Example 2

First, 75% by weight of tetramethylolmethane tetraacrylate and 25% by weight of divinylbenzene were polymerized by suspension polymerization, and after that spacers having a mean particle diameter of 7.05 µm (standard deviation 0.25 µm) were selected by the classification.

The K-value of the spacers at 10% compression deformation was 450 µkgf/mm$^2$. Also, the recovery factor of the spacers after the compression deformation was 54%.

The cell gap value of the liquid crystal cell produced in the same way as in Example 1 except hat the above spacers were used was in the range of 6.88 ±0.03 µm. Also, color irregularity in density was not observed when the polarizing sheet was applied to the liquid crystal cell in the same way as in Example 1, and the display performance was good when it was lit up.

Example 3

First, 50% by weight of tetramethylolmethane tetraacrylate and 50% by weight of divinylbenzene were polymerized by suspension polymerization, and after that spacers having a mean particle diameter of 7.02 µm (standard deviation 0.26 µm) were selected by the classification.

The K-value of the spacers at 10% compression deformation was 390 kgf/mm$^2$. Also, the recovery factor of the spacers after the compression deformation was 50%.

The cell gap value of the liquid crystal cell produced in the same way as in Example 1 except that the above spacers were used was in the range of 6.83±0.04 µm. Also, color irregularity in density was not observed when the polarizing sheet was applied to the liquid crystal cell in the same way as in Example 1, and the display performance was good when it was lit up.

Example 4

First, 25% by weight of tetramethylolmethane tetraacrylate and 75% by weight of divinylbenzene were polymerized by suspension polymerization, and after that spacers having a mean particle diameter of 7.03 μm (standard deviation 0.28 μm) were selected by the classification.

The K-value of the spacers at 10% compression deformation was 380 kgf/mm². Also, the recovery factor of the spacers after the compression deformation was 45%.

The gap value of the liquid crystal cell produced in the same way as in Example 1 except that the above spacers were used was in the range of 6.80±0.03 μm. Also, color irregularity in density was not observed when the polarizing sheet was applied to the liquid crystal cell in the same way as in Example 1, and the display performance was good when it was lit up.

Example 5

Divinylbenzene was polymerized by suspension polymerization, and after that spacers having a mean particle diameter of 7.05 μm (standard deviation 0.29 μm) were selected by the classification.

The K-value of the spacers at 10% compression deformation was 280 kgf/mm². Also, the recovery factor of the spacers after the compression deformation was 35%.

The gap value of the liquid crystal cell produced in the same way as in Example 1 except hat the above spacers were used was in the range of 6.78±0.06 μm. Also, color irregularity in density was not observed when the polarizing sheet was applied to the liquid crystal cell in the same way as in Example 1, and the display performance was good when it was lit up.

Comparative Example 1

A liquid crystal display element was obtained in the same way as in Example 1 except that spacers made of benzoguanamine polymers and having a mean particle diameter of 6.98 μm (standard deviation 0.25 μm) were used.

The K-value of the spacers at 10% compression deformation was 600 kgf/mm² and the recovery factor of the spacers after the compression deformation was 13%.

The cell gap value of the liquid crystal cell produced in the same way as in Example 1 except that the above spacers were used was in the range of 6.92 ±0.07 μm. The color irregularity in density was observed when the polarizing sheet was applied to the liquid crystal cell in the same way as in Example 1, and the display performance was unsatisfactory when it was lit up.

Comparative Example 2

First, 30% by weight of triallyl isocyanurate and 70% by weight of diallyl phthalate were polymerized by suspension polymerization, and after that spacers having a mean particle diameter of 7.03 μm (standard deviation 0.28 μm) were obtained. The K-value of the spacers at 10% compression deformation was 240 kgf/mm². Also, the recovery factor of the spacers after the compression deformation was 12%.

The cell gap value of the liquid crystal cell produced in the same way as in Example 1 except that the above spacers were used was in the range of 6.89 ±0.03 μm. The color irregularity in density was observed when the polarizing sheet was applied to the liquid crystal cell in the same way as in Example 1, and the display performance was unsatisfactory when it was lit up.

Comparative Example 3

Spherical spacers were obtained in the same way as in Example 1 except that spacers made of polystyrene and having a mean particle diameter of 6.98 μm (standard deviation 0.25 μm) were used.

The K-value of the spacers at 10% compression deformation was 105 kgf/mm². The recovery factor of the spacers after the compression deformation was unmeasurable.

The cell gap value of the liquid crystal cell produced in the same way as in Example 1 except that the above spacers were used was in the range of 6.75±0.07 μm. The color irregularity in density was observed when the polarizing sheet was applied to the liquid crystal cell in the same way as in Example 1, and the display performance was unsatisfactory when it was lit up.

Comparative Example 4

A liquid crystal display element was obtained in the same way as in Example 1 except that spacers made of benzoguanamine polymers and having a mean particle diameter of 7.05 μm (standard deviation 0.25 μm) were used.

The K-value of the spacers at 10% compression deformation was 620 kgf/mm², and the recovery factor of the spacers after the compression deformation was 13%.

The cell gap value of the liquid crystal cell produced in the same way as in Example 1 except that the above spacers were used was in the range of 6.88±0.05 μm. The color irregularity in density was observed when the polarizing sheet was applied to the liquid crystal cell in the same way as in Example 1, and the display performance was unsatisfactory when it was lit up.

Comparative Example 5

A liquid crystal display element was obtained in the same way as in Example 1 except that spacers made of silicon dioxide and having a mean particle diameter of 7.01 μm (standard deviation 0.19 μm) were used.

The K-value of the spacers at 10% compression deformation was 5000 kgf/mm², and the recovery factor of the spacers after the compression deformation was 85%.

The cell gap value of the liquid crystal cell produced in the same way as in Example 1 except that the above spacers were used was in the range of 6.99±0.10 μm. The color irregularity in density was observed when the polarizing sheet was applied to the liquid crystal cell in the same way as in Example 1, and the display performance was unsatisfactory when it was lit up.

Example 6

First, tetramethylolmethane triacrylate was polymerized by suspension polymerization, and after that resin fine particles having a mean particle diameter of 7.03 μm (standard deviation 0.27 μm) were selected by the classification. 100 g of concentrated sulfuric acid was added to 10 g of these fine particles. The mixture was reacted with acid at 55° C. for 6 hours.

Next, 6 g of a basic dye (CATIRON BLACK SBH) (manufactured by Hodogaya Kagaku Co., Ltd.) was dissolved in 300 ml of water, and a dye bath solution was obtained by adjusting this solution to pH4 with acetic acid. Then, the aforesaid acid-treated fine particles were added to this dye bath solution, and a dyeing treatment was performed at 95° C. for 6 hours to obtain black spherical spacers. A mean particle diameter and a standard deviation of the spacers were 7.38 μm and 0.29 μm, respectively.

The K-value of the colored spacers at 10% compression deformation was 520 kgf/mm². Also, the recovery factor of the colored spacers after the compression deformation was 55% in the case of the maximum load value of 1 grf.

A liquid crystal display element was obtained in the same way as in Example 1 except that the above-mentioned spacers were used. The cell gap value of the liquid crystal cell was in the range of 6.98±0.03 μm.

Also, color irregularity in density was not observed when The polarizing sheet was applied to the liquid crystal cell in the same way as in Example 1, and the display performance was good when it was lit up.

Example 7

First, 75% by weight of tetramethylolmethane tetraacrylate and 25% by weight of divinylbenzene were polymerized by suspension polymerization, and after that spacers having a mean particle diameter of 7.05 μm (standard deviation 0.25 μm) were selected by the classification. These spacers were dyed in the same way as in Example 6 to obtain black spherical spacers. A mean particle diameter and a standard deviation of the spherical spacers were 7.04 μm and 0.27 μm, respectively.

The K-value of the spacers at 10% compression deformation was 420 kgf/mm². Also, the recovery factor of the spacers after the compression deformation was 51%.

The cell gap value of the liquid crystal cell produced in the same way as in Example 1 except that the above-mentioned spacers were used was in the range of 7.22±0.03 μm. Also, color irregularity in density was not observed when the polarizing sheet was applied to the liquid crystal cell in the same way as in Example 1, and the display performance was good when it was lit up.

Example 8

First, 50% by weight of tetramethylolmethane tetraacrylate and 50% by weight of divinylbenzene were polymerized by suspension polymerization, and after that spacers having a mean particle diameter of 7.02 μm (standard deviation 0.26 μm) were selected by the classification. These spacers were dyed in the same way as in Example 6 to obtain black spherical spacers. A mean particle diameter and a standard deviation of the spherical spacers were 7.47 μm and 0.28 μm, respectively.

The K-value of the spacers at 10% compression deformation was 370 kgf/mm². Also, the recovery factor of the spacers after the compression deformation was 47%.

The cell gap value of the liquid crystal cell produced in the same way as in Example 1 except that the above-mentioned spacers were used was in the range of 6.83±0.04 μm. Also, color irregularity in density was no observed when the polarizing sheet was applied to the liquid crystal cell in the same way as in Example 1, and the display performance was good when it was lit up.

Example 9

First, 25% by weight of tetramethylolmethane tetraacrylate and 75% by weight of divinylbenzene were polymerized by suspension polymerization, and after that spacers having a mean particle diameter of 7.03 μm (standard deviation 0.28 μm) were selected by the classification. These spacers were dyed in the same way as in Example 6 to obtain black spherical spacers. A mean particle diameter and a standard deviation of the spherical spacers were 7.45 μm and 0.30 μm, respectively.

The K-value of the spacers at 10% compression deformation was 360 kgf/mm². Also, the recovery factor of the spacers after the compression deformation was 45%.

The cell gap value of the liquid crystal cell produced in the same way as in Example 1 except that the above-mentioned spacers were used was in the range of 6.80±0.03 μm. Also, color irregularity in density was not observed when the polarizing sheet was applied to the liquid crystal cell in the same way as in Example 1, and the display performance was good when it was lit up.

Example 10

First, divinylbenzene was polymerized by suspension polymerization, and after that spacers having a mean particle diameter of 7.05 μm (standard deviation 0.29 μm) were selected by the classification. These spacers were dyed in the same way as in Example 6 to obtain black spherical spacers. A mean particle diameter and a standard deviation of the spherical spacers were 7.40 μm and 0.30 μm, respectively.

The K-value of the spacers at 10% compression deformation was 270 kgf/mm². Also, the recovery factor of the spacers after the compression deformation was 40%.

The cell gap value of the liquid crystal cell produced in the same way as in Example 1 except that the above-mentioned spacers were used was in the range of 7.12±0.05 μm. Also, color irregularity in density was not observed when the polarizing sheet was applied to the liquid crystal cell in the same way as in Example 1, and the display performance was good when it was lit up.

Comparative Example 6

First, spacers made of benzoguanamine copolymers and having a mean particle diameter of 6.98 μm (standard deviation 0.25 μm) were dyed red with an acid dye to obtain colored spacers. The colored spacers had a mean particle diameter of 7.01 μm (standard deviation 0.27 μm).

The K-value of the spacers at 10% compression deformation was 580 kgf/mm². Also, the recovery factor of the spacers after the compression deformation was 11%.

The cell gap value of the liquid crystal cell produced in the same way as in Example 1 except that the above-mentioned spacers were used was in the range of 6.96±0.08 μm. Also, color irregularity in density was observed when the polarizing sheet was applied to the liquid crystal cell in the same way as in Example 1, and the display performance was unsatisfactory when it was lit up.

Comparative Example 7

First, 30% by weight of triallyl isocyanurate and 70% by weight of diallyl phthalate were polymerized by suspension polymerization, and after that spacers having a mean particle diameter of 7.03 μm (standard deviation 0.26 μm) were selected by the classification. These spacers were dyed in the same way as in Example 6 to obtain black spherical spacers. A mean particle diameter and a standard deviation of the spherical spacers were 7.38 μm and 0.27 μm, respectively.

The K-value of the spacers at 10% compression deformation was 220 kgf/mm². Also, the recovery factor of the spacers after the compression deformation was 12%.

The cell gap value of the liquid crystal cell produced in the same way as in Example 1 except that the above-mentioned spacers were used was in the range of 7.23±0.04 µm. Also, color irregularity in density was observed when the polarizing sheet was applied to the liquid crystal cell in the same way as in Example 1, and the display performance was unsatisfactory when it was lit up.

Comparative Example 8

First, black spherical spacers were obtained in the same way as in Example 6 except that the spacers made of polystyrene and having a mean particle diameter of 6.98 µm (standard deviation 0.25 µm) were used. The colored spacers had a mean particle diameter of 7.47 µm (standard deviation 0.29 µm). The K-value of the colored spacers at 10% compression deformation was 100 kgf/mm$^2$. Also, the recovery factor of the spacers after the compression deformation was not measurable.

The cell gap value of the liquid crystal cell produced in the same way as in Example 1 except that the above-mentioned spacers were used was in the range of 6.75±0.07 µm. Also, color irregularity in density was observed when the polarizing sheet was applied to the liquid crystal cell in the same way as in Example 1, and the display performance was unsatisfactory when it was lit up.

Comparative Example 9

A liquid crystal display element was obtained in the same way as in Example 1 except that spacers made of benzoguanamine polymers and having a mean particle diameter of 7.05 µm (standard deviation 0.25 µm). The spacers were dyed in the same was as n Comparative Example 6 obtain red spherical spacers. A mean particle diameter and a standard deviation of the spherical spacers were 7.08 µm and 0.27 µm, respectively. The K-value of the colored spacers at 10% compression deformation was 605 kgf/mm$^2$, and the recovery factor of the colored spacers after the compression deformation was 11%.

The cell gap value of the liquid crystal cell produced in the same way as in Example 1 except that the above-mentioned spacers were used was in the range of 6.91±0.08 µm. Also, color irregularity in density was observed when the polarizing sheet was applied to the liquid crystal cell in the same way as in Example 1, and the display performance was unsatisfactory when it was lit up.

Comparative Example 10

First, spacers made of silicon dioxide and having a mean particle diameter of 7.01 µm (standard deviation of 0.19 µm) were dyed with a basic dye to obtain blue spherical spacers. A mean particle diameter and a standard deviation of the colored spacers were 7.04 µm and 0.21 µm, respectively. The K-value of the colored spacers at 10% compression deformation was 5000 kgf/mm$^2$, and the recovery factor of the spacers after the compression deformation was 85%.

The cell gap value of the liquid crystal cell produced in the same way as in Example 1 except that the above-mentioned spacers were used was in the range of 7.00±0.10 µm. Also, color irregularity in density was observed when the polarizing sheet was applied to the liquid crystal cell in the same way as in Example 1, and the display performance was unsatisfactory when it was lit up.

Example 11

First, 75% by weight of tetramethylolmethane tetraacrylate and 25% by weight of divinylbenzene were polymerized by suspension polymerization, and after that fine particles having a mean particle diameter of 10.00 µm (standard deviation 0.40 µm) were selected by the classification.

Then, a solution prepared by dissolving 0.15 g of tetrapropoxytitanium (Trade name A-1, manufactured by Nippon Soda Co., Ltd.) in 15 ml of n-hexane was added to 10 g of the fine particles, and were well mixed with a spatula, after which the n-hexane was evaporated. Next, this mixture was thoroughly ground in a mortar, eliminating any lumps.

Then, 2.6 g of waxy polyethylene (Trade name SANWAX 151-P, manufactured by Sanyo Kasei Kogyo Co., Ltd.) was added to toluene as a hot-melt adhesive resin, and was dissolved in a hot bath at 80° C. To this solution was added the above resin fine particles treated with an organic titanium compound, and dispersed until the solution was completely emulsified, after which the solution was dried by heating under reduced pressure of 300 mm/Hg at 90° C.

In this way, the lumps in which the resin fine particles were coated with the hot-melt adhesive resin was obtained. Next, 20 ml of glycerins was added to the lumps and the lumps were thoroughly ground in a mortar. Furthermore, the lumps were passed through three sets of rollers to be completely decomposed.

Next, the decomposed lumps were washed on a glass filter with 1 liter of ethanol and were suspended in a mixed ethanol/Freon-113 solution (volume ratio 2:1). The mixture was then left standing undisturbed in this state for 15 hours, and the supernatant was decanted to remove minute flakes of waxy polyethylene. The remaining decomposed lumps were again filtered with a glass filter, then washed with Freon-113, and dried in a gear oven at 60° C. to obtain coated resin fine particles.

The coated resin fine particles had a mean particle diameter of 10.42 µm (standard deviation 0.43 µm). As a result, it was found that waxy polyethylene was formed on the surfaces of The resin fine particles to an average thickness of 0.16 µm. The observation of the surfaces of the coated resin fine particles by using a scanning electron microscope showed that the surfaces of the resin fine particles were uniformly coated with waxy polyethylene without any gaps.

The K-value of the coated resin fine particles at 10% compression deformation was 450 kgf/mm$^2$, and the recovery factor of the particles after the compression deformation in the case of the maximum load value of 1 grf was 63%.

A liquid crystal display element was obtained in the same way as in Example 1 except that the above coated resin fire particles spacers were used as spacers. The cell gap value of the liquid crystal cell was in the range of 9.95±0.03 µm.

Also, color irregularity in density was not observed when the polarizing sheet was applied to the liquid crystal cell in the same way as in Example 1, and the display performance was good when it was lit up.

Example 12

First, divinylbenzene was polymerized by suspension polymerization, and after that fine particles having a mean particle diameter of 9.90 µm (standard deviation 0.36 µm) were selected by the classification. A solution prepared by dissolving 0.15 g of tetrapropoxytitanium (Trade name A-1, manufactured by Nippon Soda Co., Ltd.) in 15 ml of n-hexane was added to 10 g of the fine particles, and were well mixed with a spatula, after which the n-hexane was evaporated. Next, this mixture was thoroughly ground in a mortar, eliminating the lumps.

Then, 2 g of solid epoxy resin with an epoxy equivalent of 480 and a softening point of 68° C. (Trade name EPI-COAT 1001, manufactured by Yuka Shell Epoxy, Co., Ltd.) was dissolved in 40 ml of acetone, and to this solution was added 6 ml of water, 10 g of the aforesaid fine particles, and as a hardening agent, 0.4 g of 2-ethyl-4-methylimidazole 2E4MZ. After through mixing, the acetone was evaporated, while stirring. Then, the dried material was crushed in a mortar and the lumps were completely demolished.

The mean particle diameter of the coated resin fine particles so obtained was 10.32 μm (standard deviation 0.46 μm). From this result, the thickness of the adhesive epoxy resin layer was calculated to be 0.21 μm. Examination of the surfaces of these coated resin fine particles with a scanning electron microscope revealed that the surfaces of the resin fine particles were uniformly coated with the epoxy resin layers without any gaps.

The K-value of the coated resin fine particles at 10% compression deformation was 420 kgf/mm$^2$, and the recovery factor of the particles after the compression deformation in the case of the maximum load value of 1 grf was 52%.

A liquid crystal display element was obtained in the same way as in Example 1 except that the above coated resin fine particles were used as spacers. The cell gap value of the liquid crystal cell was in the range of 9.83±0.03 μm.

Also, color irregularity in density was not observed when the polarizing sheet was applied to the liquid crystal cell in the same way as in Example 1, and the display performance was good when it was lit up.

Comparative Example 11

First, inorganic fine particles made of glass silicate and having a mean particle diameter of 7.30 μm (standard deviation 0.32 μm) were obtained. Then, a solution prepared by dissolving 0.35 g of tetrapropoxytitanium (Trade name B-1, manufactured by Nippon Soda Co., Ltd.) in 15 ml of n-hexane was added to 10 g of the inorganic fine particles, and were well mixed with a spatula, after which the n-hexane was evaporated. Next, this mixture was thoroughly ground in a mortar, eliminating the lumps.

Then, 2.9 g of carboxyl group-containing ethylene-vinyl acetate copolymer (Trade name DUMILAN C-2280, manufactured by Takeda Yakuhin Kogyo Co., Ltd. ) was used as a hot-melt adhesive resin.

The coated inorganic fine particles were obtained in the same way as in Example 11 except for the above. The examination of the surfaces of the coated inorganic resin fine particles by the scanning electron microscope revealed that the thickness of the hot-melt adhesive layers formed on the coated inorganic fine particles were 0.43 μm.

The K-value of the coated inorganic fine particles at 10% compression deformation was 5500 kgf/ mm$^2$, and the recovery factor of the particles after the compression deformation in the case of the maximum load value of 1 grf was 85%.

A liquid crystal display element was obtained in the same way as in Example 1 except that the above coated inorganic fine particles were used as spacers. The cell gap value of the liquid crystal cell was in the range of 7.25±0.03 μm.

Also, color irregularity in density was observed when the polarizing sheet was applied to the liquid crystal cell in the same way as in Example 1, and the display performance was unsatisfactory when it was lit up.

Comparative Example 12

First, as solid particles, inorganic fine particles made of glass silicate and having a mean particle diameter of 7.30 μm (standard deviation 0.32 μm) were obtained. A solution prepared by dissolving 0.35 g of tetra propoxytitanium (Trade name B-1, manufactured by Nippon Soda Co., Ltd.) in 15 ml of n-hexane was added to 10 g of the inorganic fine particles, and were well mixed with a spatula, after which the n-hexane was evaporated. Next, This mixture was thoroughly ground in a mortar, eliminating the lumps.

Then, as a hardening agent, 0.2 g of dicyandiamide (Trade name DICY-7, manufactured by Yuka Shell Epoxy, Co., Ltd. ) and 0.2 g of 2-phenylimidazole-4,5-diyldimethanol (Trade name 2PHZ, manufactured by Shikoku Kasei Kogyo Co., Ltd. ) were used.

The coated inorganic fine particles were obtained in the same way as in Example 12 except for the above. The examination of the surfaces of the coated inorganic fine particles by the scanning electron microscope revealed that the thickness of the adhesive epoxy resin layers formed on the coated inorganic fine particles were 0.41 μm.

The K-value of the coated inorganic fine particles at 10% compression deformation was 5300 kgf/ mm$^2$, and the recovery factor of the particles after the compression deformation in the case of the maximum load value of 1 grf was 87%.

The liquid crystal display element was obtained in the same way as in Example 1 except that the above coated inorganic fine particles were used as spacers. The cell gap value of the liquid crystal cell was in The range of 7.23±0.03 μm.

Also, color irregularity in density was observed when the polarizing sheet was applied To the liquid crystal cell in the same way as in Example 1, and the display performance was unsatisfactory when it was lit up.

Example 13

First, tetramethylolmethane tetraacrylate was polymerized by suspension polymerization, and after that fine particles having a mean particle diameter of 6.98 μm (standard deviation 0.23 μm) were selected by the classification. The K-value of the fine particles at 10% compression deformation was 633 kgf/mm$^2$ and the recovery factor after the compression deformation in the case of the maximum load value of 1 grf was 63%.

The resin fine particles were subjected to electroless nickel plating, after which conductive fine particles on which nickel-gold plated layers were formed were obtained by the gold substitution reaction. The analysis of the conductive fine particles showed that gold content and nickel content were 28.0% by weight and 23.8% by weight. A mean particle diameter was 7.24 μm (standard deviation 0.28 μm).

Figure 6:
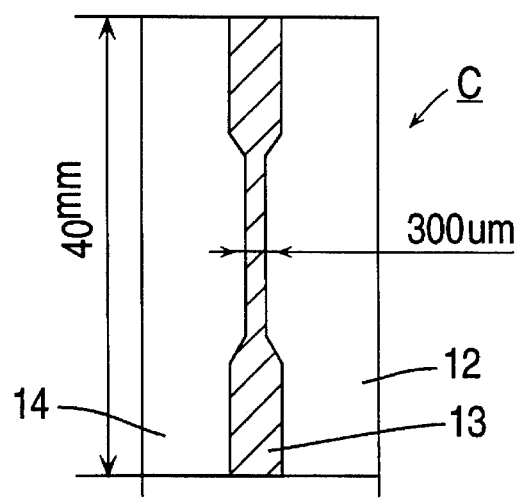
FIG. 6 is a cross-sectional view showing a test chip (an ITO/glass electrode for test) produced in Example 13.

Then, 1 g of the conductive fine particles and 0.5 g of glass fibers (diameter: 5.5 μm, average length: 27.5 m) were mixed with 75 g of epoxy resin (Trade name SE-4500, manufactured by Yoshikawa Kagaku Kogyo Co., Ltd.) and 25 g of a hardening agent to form a paste. Next, as shown in FIG. 6, the paste 13 was coated to a predetermined thickness on a glass electrode 12 comprising an ITO film on an inner surface thereof, and another ITO electrode 14 was superimposed. This lamination was sandwiched by a press machine and press heated a 35 kg/cm² and 160° C.

A test chip C so produced was tested through 240 cycles by using a thermal shock testing apparatus (Trade name TSV-40, manufactured by Tabai Espec Corp.) which operates at 90° C. for one hour and at −4° C. for one hour.

Another test chip produced in the same way as the above was put in a thermo-hygrostat (Trade name PR-3F, manufactured by Tabai Espec Corp.) which operates under the conditions of 80° C. and 90% RH and Tested for 500 hours. The contact resistance between two electrodes were measured before and after the thermal shock test and the moisture proof test by using the four terminal method. The results are shown in Table 1. From the results, it was found that the contact reliability of the conductive fine particles were excellent.

Example 14

First, 75% by weight of tetramethylolmethane tetraacrylate and 25% by weight of divinylbenzene were polymerized by suspension polymerization, and after that fine particles having a mean particle diameter of 7.05 μm (standard deviation 0.25 μm) were selected by the classification. The K-value of the fine particles a 10% compression deformation was 527 kgf/mm² and the recovery factor after The compression deformation in The case of the maximum load value of 1 grf was 55%.

The resin fine particles were subjected to electroless nickel plating, after which conductive fine particles on which nickel-gold plated layers were formed were obtained by the gold substitution reaction. The analysis of the conductive fine particles showed that gold content and nickel content were 29.1% by weight and 23.4% by weight, respectively. The mean particle diameter was 7.29 μm (standard deviation 0.29 μm).

A test chip was obtained in the same way as in Example 13 except that the above conductive fine particles were used. The reliability of this test chip was tested. The results are shown in Table 1. From the results, it was found that the contact reliability of the conductive fine particles was excellent.

Example 15

First, 50% by weight of tetramethylolmethane tetraacrylate and 50% by weight of divinylbenzene were polymerized by suspension polymerization, and after that fine particles having a mean particle diameter of 7.01 μm (standard deviation 0.25 μm) were selected by the classification. The K-value of the fine particles at 10% compression deformation was 468 kgf/mm² and the recovery factor after the compression deformation in the case of the maximum load value of 1 grf was 52%.

The resin fine particles were subjected to electroless nickel plating, after which conductive fine particles on which nickel-gold plated layers were formed were obtained by the gold substitution reaction. The analysis of the conductive fine particles showed that gold content and nickel content were 30.5% by weight and 19.5% by weight, respectively. The mean particle diameter was 7.25 μm (standard deviation 0.29 μm).

A test chip was obtained in the same way as in Example 13 except that the above conductive fine particles were used. The reliability of this test chip was tested. The results are shown in Table 1. From the results, it was found that the contact reliability of the conductive fine particles was excellent.

Example 16

First, 25% by weight of tetramethylolmethane tetraacrylate and 75% by weight of divinylbenzene were polymerized by suspension polymerization, and after that fine particles having a mean particle diameter of 7.03 μm (standard deviation 0.28 μm) were selected by the classification. The K-value of the fine particles at 10% compression deformation was 448 kgf/mm² and the recovery factor after the compression deformation in the case of the maximum load value of 1 grf was 52%.

The resin fine particles were subjected to electroless nickel plating, after which conductive fine particles on which nickel-gold plated layers were formed were obtained by the gold substitution reaction. The analysis of the conductive fine particles showed that gold content and nickel content were 27.6% by weight and 24.3% by weight, respectively. The mean particle diameter was 7.27 μm (standard deviation 0.29 μm).

A test chip was obtained in the same way as in Example 13 except that the above conductive fine particles were used. The reliability of this test chip was tested. The results are shown in Table 1. From the results, it was found that the contact reliability of the conductive fine particles was excellent.

Example 17

First, divinylbenzene was polymerized by suspension polymerization, and after that fine particles having a mean particle diameter of 7.05 μm (standard deviation 0.29 μm) were selected by the classification. The K-value of the fine particles a 10% compression deformation was 330 kgf/mm² and the recovery factor after the compression deformation in the case of the maximum load value of 1 grf was 38%.

The resin fine particles were subjected to electroless nickel plating, after which conductive fine particles on which nickel-gold plated layers were formed were obtained by the gold substitution reaction. The analysis of the conductive fine particles showed that gold content and nickel content were 25.6% by weight and 18.3% by weight, respectively. The mean particle diameter was 7.30 μm (standard deviation 0.32 μm).

A test chip was obtained in the same way as in Example 13 except that the above conductive fine particles were used. The reliability of this test chip was tested. The results are shown in Table 1. From the results, it was found that the contact reliability of the conductive fine particles was excellent.

Comparative Example 13

Spacers made of benzoguanamine polymers and having a mean particle diameter of 6.98 μm (standard deviation 0.25 μm) were subjected to electroless nickel plating, after which conductive fine particles on which nickel-gold plated layers were formed by the gold substitution reaction were obtained. The analysis of the conductive fine particles showed that gold content and nickel content were 30.4% by weight and 19.6% by weight, respectively. The mean particle diameter was 7.23 μm (standard deviation 0.27 μm). The K-value of the conductive fine particles at 10% compression deformation was 690 kgf/mm² and the recovery factor after the compression deformation was 12%.

A test chip was obtained in the same way as in Example 13 except that the above conductive fine particles were used. The reliability of this test chip was tested. The results are shown in Table 1. From the results, it was found that the contact reliability of the conductive fine particles was poor.

Comparative Example 14

First, 30% by weight of triallyl isocyanurate and 70% by weight of diallyl phthalate were polymerized by suspension polymerization, and after that fine particles having a mean particle diameter of 7.00 μm (standard deviation 0.28 μm) were selected by the classification. The K-value of the fine particles at 10% compression deformation was 245 kgf/mm$^2$ and the recovery factor after the compression deformation was 12%.

The fine particles were subjected to electroless nickel plating, after which conductive fine particles on which nickel-gold plated layers were formed were obtained by the gold substitution reaction. The analysis of the conductive fine particles showed that gold content and nickel content were 29.3% by weight and 20.9% by weight, respectively. The mean particle diameter was 7.23 μm (standard deviation 0.30 μm).

A test chip was obtained in the same way as in Example 13 except that the above conductive fine particles were used. The reliability of this test chip was tested. The results are shown in Table 1. From the results, it was found that the contact reliability of the conductive fine particles was poor.

Comparative Example 15

First, fine particles made of polystyrene and having a mean particle diameter of 6.98 μm (standard deviation 0.27 μ) were subjected to electroless nickel plating, after which conductive fine particles on which nickel-gold plated layers were formed by the gold substitution reaction were obtained. The analysis of the conductive fine particles showed that the gold content and nickel content were 32.2% by weight and 18.3% by weight, respectively. The mean particle diameter was 7.23 μm (standard deviation 0.29 μm). The K-value of the conductive fine particles at 10% compression deformation was 116 kgf/mm$^2$ and the recovery factor after the compression deformation was not measurable.

The test chip was obtained in the same way as in Example 13 except that the above conductive fine particles were used. The reliability of this test chip was tested. The results are shown in Table 1. From the results, it was found that the contact reliability of the conductive fine particles was poor.

Comparative Example 16

First, fine particles made of silicon dioxide having a mean particle diameter of 7.01 μm (standard deviation 0.19 μm) were obtained. The K-value of the fine particles at 10% compression deformation was 5100 kgf/mm$^2$ and the recovery factor of the fine particles after the compression deformation was 85%.

The fine particles were subjected to electroless nickel plating, after which conductive fine particles on which nickel-gold plated layers were formed by the gold substitution reaction were obtained. The analysis of the conductive fine particles showed that the gold content and nickel content were 27.4% by weight and 19.6% by weight, respectively. The mean particle diameter was 7.25 μm (standard deviation 0.20 μm).

A test chip was obtained in the same way as in Example 13 except that the above conductive fine particles were used. The reliability of this test chip was tested. The results are shown in Table 1. From the results, it was found that the contact reliability of the conductive fine particles was poor.

TABLE 1

| | Thermal shock test | | Moisture proof test | |
| --- | --- | --- | --- | --- |
| | Electric resistance (Ω) before test | Electric resistance (Ω) after test | Electric resistance (Ω) before test | Electric resistance (Ω) after test |
| Example 13 | 1.3 | 1.4 | 1.5 | 1.7 |
| Example 14 | 0.8 | 0.7 | 1.9 | 1.8 |
| Example 15 | 1.1 | 1.1 | 1.3 | 1.1 |
| Example 16 | 0.5 | 0.7 | 0.9 | 0.8 |
| Example 17 | 0.7 | 0.8 | 0.8 | 0.7 |
| Comparative Example 13 | 0.5 | 2.8 | 0.7 | 3.1 |
| Comparative Example 14 | 0.8 | 10.1 | 0.9 | 12.3 |
| Comparative Example 15 | 0.3 | 149.0 | 0.4 | 253.0 |
| Comparative Example 16 | 58.0 | 98.0 | 73.0 | 135.0 |

Example 18

First, tetramethylolmethane tetraacrylate was polymerized by suspension polymerization, after which fine particles having a mean particle diameter of 6.98 μm (standard deviation 0.23 μm) were selected by the classification. The K-value of the fine particles at 10% compression deformation was 570 kgf/mm$^2$, and the recovery factor of the fine particles after the compression deformation in the case of the maximum load value of 1 grf was 63%.

The resin fine particles were subjected to electroless copper plating, after which copper was replaced with indium by the substitution reaction. The analysis of the conductive fine particles showed that the indium content was 23.4%.

Then, 1 g of the conductive fine particles and 0.5 g of glass fibers (diameter: 5.5 μm, average length: 27.5 μm) were mixed with 75 g of epoxy resin (Trade name SE-4500, manufactured by Yoshikawa Kagaku Kogyo Co., Ltd.) and 25 g of hardening agent to form paste. Next, as shown in FIG. 6, the paste 13 was coated to a predetermined thickness on a glass electrode 12 comprising an ITO film on an inner surface thereof, and another ITO electrode 14 was superimposed. This lamination was sandwiched by a press machine and heat pressed at 35 kg/cm² and 160° C. for 30 minutes.

A test chip C so produced was tested through 240 cycles by using a thermal shock testing apparatus (Trade name TSV-40, manufactured by Tabai Espec Corp.) which operates at 90° C. for one hour and at −4° C. for one hour.

Another test chip produced in the same way as the above was put into a thermo-hygrostat (Trade name PR-3F, manufactured by Tabai Espec Corp.) which operates under the conditions of 80° C. and 90% RH and tested for 500 hours. The contact resistance between two electrodes were measured before and after the thermal shock test and the moisture proof test by using the four terminal method. The results are shown in Table 2. From the results, it was found that the contact reliability of the conductive fine particles was excellent.

Example 19

First, 75% by weight of tetramethylolmethane tetraacrylate and 25% by weigh of divinylbenzene were polymerized by suspension polymerization, after which fine particles having a mean particle diameter of 7.05 µm (standard deviation 0.25 µm) were obtained. The K-value of the fine particles at 10% compression deformation was 475 kgf/mm², and the recovery factor of the fine particles after the compression deformation in the case of the maximum load value of 1 grf was 55%.

The resin fine particles were subjected to electroless copper plating, after which the copper plated layer was subjected to the substitution reaction to replace copper with indium. The analysis of resin fine particles showed that the indium content was 19.8%.

A test chip was obtained in the same way as in Example 18 except that these conductive fine particles were used. The reliability of the test chip was tested. The results are shown in Table 2. From the results, it was found that the contact reliability of the conductive fine particles were excellent.

Example 20

First, 50% by weight of tetramethylolmethane tetraacrylate and 50% by weight of divinylbenzene were polymerized by suspension polymerization, after which fine particles having a mean particle diameter of 7.01 µm (standard deviation 0.25 µm) were obtained. The K-value of the fine particles at 10% compression deformation was 422 kgf/mm², and the recovery factor of the fine particles after the compression deformation in the case of the maximum load value of 1 grf was 52%.

The resin fine particles were subjected to electroless copper plating, after which the copper layer so obtained was subjected to the substitution reaction to replace copper with indium. The analysis of the resin fine particles showed that the indium content was 20.3%.

A test chip was obtained in the same way as in Example 18 except that these conductive fine particles were used. The reliability of the test chip was tested. The results are shown in Table 2. From the results, it was found that the contact reliability of the conductive fine particles was excellent.

Example 21

First, tetramethylolmethane triacrylate was polymerized by suspension polymerization, after which fine particles having a mean particle diameter of 7.53 µm (standard deviation 0.28 µm) were obtained. The K-value of the fine particles at 10% compression deformation was 282 kgf/mm², and the recovery factor of the fine particles after the compression deformation in the case of the maximum load value of 1 grf was 58%.

The resin fine particles were subjected to electroless copper plating, after which the copper plated layer so obtained was subjected to the substitution reaction to replace copper with indium. The analysis of the resin fine particles showed that the indium content was 19.6%.

A test chip was obtained in the same way as in Example 18 except that these conductive fine particles were used. The reliability of the test chip was tested. The results are shown in Table 2. From the results, it was found that the contact reliability of the conductive fine particles was excellent.

Comparative Example 17

First, fine particles made of benzoguanamine polymers and having a mean particle diameter of 6.98 µm (standard deviation 0.25 µm) were obtained. The K-value of the fine particles at 10% compression deformation was 620 kgf/mm², and the recovery factor after the compression deformation in the case of the maximum load value of 1 grf was 12%. The fine particles were subjected to electroless copper plating, after which the copper plated layer so obtained was subjected to the substitution reaction to replace copper with indium. The analysis of the fine particles showed that the indium content was 22.6%.

A test chip was obtained in the same way as in Example 18 except that these above conductive fine particles were used. The reliability of the test chip was tested. The results are shown in Table 2. From the results, it was found that the contact reliability of the conductive fine particles was poor.

Comparative Example 18

First, fine particles made of silicon dioxide and having a mean particle diameter of 7.01 µm (standard deviation 0.19 µm) were obtained. The K-value of the fine particles at 10% compression deformation was 4590 kgf/mm². The recovery factor of the fine particles after the compression deformation was 85%.

The fine particles were subjected to electroless copper plating, after which the copper plated layer so obtained was subjected to the substitution reaction to replace copper with indium. The analysis of the fine particles showed that the indium content was 9.8% by weight.

A test chip was obtained in the same way as in Example 18 except that the above conductive fine particles were used. The reliability of the test chip was tested. The result are shown in Table 2. From the results, it was found that the contact reliability of the conductive fine particles was poor.

TABLE 2

| | Thermal shock test | | Moisture proof test | |
| --- | --- | --- | --- | --- |
| | Electric resistance ($\Omega$) before test | Electric resistance ($\Omega$) after test | Electric resistance ($\Omega$) before test | Electric resistance ($\Omega$) after test |
| Example 18 | 3.2 | 3.4 | 3.1 | 3.3 |
| Example 19 | 2.8 | 2.7 | 3.0 | 2.8 |
| Example 20 | 2.5 | 2.4 | 2.6 | 2.7 |
| Example 21 | 1.8 | 1.9 | 2.0 | 1.9 |
| Comparative Example 17 | 5.3 | 20.5 | 5.4 | 17.2 |
| Comparative Example 18 | 4.7 | 83.5 | 5.3 | 22.3 |

We claim:

1. A fine sphere having: a K-value defined as $$K = (3/\sqrt{2}) \cdot F \cdot S^{-3/2} \cdot R^{-1/2}$$

(wherein F and S represent a load value (kgf) and a compression displacement (mm) at 10% compression deformation of said fine sphere, respectively, and R represents a radius (mm) of said fine sphere) which is in the range of 250 kgf/mm² to 700 kgf/mm² at 20° C.; and a recovery factor after the compression deformation which is in the range of 30% to 80% at 20° C., wherein said fine sphere is made of divinylbenzene-tetramethylolmethane tetraacrylate copolymer.

2. A fine sphere according to claim 1, wherein said K-value is in the range of 350 kgf/mm² to 550 kgf/mm².

3. A fine sphere according to claim 1, wherein said recovery factor after the compression deformation is in the range of 40% to 70% at 20° C.

4. A fine sphere according to claim 1, wherein said fine sphere has a diameter in the range of 0.1 to 100 μm.

5. A fine sphere according to claim 4, wherein the diameter of said fine sphere is in the range of 0.5 to 50 μm.

6. A fine sphere according to claim 5, wherein the diameter of said fine sphere is in the range of 1.0 to 20 μm.

7. A fine sphere according to claim 1 further comprising a conductive layer formed on a surface of said fine sphere.

8. A fine sphere according to claim 7, wherein said conductive layer is an indium-plated layer.

9. A spherical spacer for a liquid crystal display element having: a K-value defined as $$K = (3/\sqrt{2}) \cdot F \cdot S^{-3/2} \cdot R^{-1/2}$$

(wherein F and S represent a load value (kgf) and a compression displacement (mm) at 10% compression deformation of said spherical spacer, respectively, and R represents a radius (mm) of said spherical spacer) which is in the range of 250 kgf/mm² to 700 kgf/mm² at 20° C.; and a recovery factor after the compression deformation which is in the range of 30% to 80% at 20° C., wherein said fine sphere is made of divinylbenzene-tetramethylolmethane tetraacrylate copolymer.

10. A colored spherical spacer for a liquid crystal display element comprising a colored core fine sphere, said colored spherical spacer having: a K-value defined as $$K = (3/\sqrt{2}) \cdot F \cdot S^{-3/2} \cdot R^{-1/2}$$

(wherein F and S represent a load value (kgf) and a compression displacement (mm) at 10% compression deformation of said colored spherical spacer, respectively, and R represents a radius (mm) of said colored spherical spacer) which is in the range of 250 kgf/mm² to 700 kgf/mm² at 20° C.; and a recovery factor after the compression deformation which is in the range of 30% to 80% at 20° C., wherein said fine sphere is made of divinylbenzene-tetramethylolmethane tetraacrylate copolymer.

11. An adhesive coated spherical spacer for a liquid crystal display element comprising a core fine sphere and an adhesive layer formed on a surface of said core fine sphere, said adhesive coated spherical spacer having: a K-value defined as $$K = (3/\sqrt{2}) \cdot F \cdot S^{-3/2} \cdot R^{-1/2}$$

(wherein F and S represent a load value (kgf) and a compression displacement (mm) at 10% compression deformation of said adhesive coated spherical spacer, respectively, and R represents a radius (mm) of said adhesive coated spherical spacer) which is in the range of 250 kgf/mm² to 700 kgf/mm² at 20° C.; and a recovery factor after the compression deformation which is in the range of 30% to 80% at 20° C., wherein said fine sphere is made of divinylbenzene-tetramethylolmethane tetraacrylate copolymer.

12. A liquid crystal display element comprising a spherical spacer, said spherical spacer having: a K-value defined as $$K = (3/\sqrt{2}) \cdot F \cdot S^{-3/2} \cdot R^{-1/2}$$

(wherein F and S represent a load value (kgf) and a compression displacement (mm) at 10% compression deformation of said spherical spacer, respectively, and R represents a radius (mm) of said spherical spacer) which is in the range of 250 kgf/mm² to 700 kgf/mm² at 20° C.; and a recovery factor after the compression deformation which is in the range of 30% to 80% at 20° C., wherein said fine sphere is made of divinylbenzene-tetramethylolmethane tetraacrylate copolymer.

13. A liquid crystal display element comprising a colored spherical spacer comprising a colored core fine sphere, said colored spherical spacer having: a K-value defined as $$K = (3/\sqrt{2}) \cdot F \cdot S^{-3/2} \cdot R^{-1/2}$$

(wherein F and S represent a load value (kgf) and a compression displacement (mm) at 10% compression deformation of said colored spherical spacer, respectively, and R represents a radius (mm) of said colored spherical spacer) which is in the range of 250 kgf/mm² to 700 kgf/mm² at 20° C.; and a recovery factor after the compression deformation which is in the range of 30% to 80% at 20° C., wherein said fine sphere is made of divinylbenzene-tetramethylolmethane tetraacrylate copolymer.

14. A liquid crystal display element comprising an adhesive coated spherical spacer comprising a core fine sphere and an adhesive layer formed on a surface of said core fine sphere, said adhesive coated spherical spacer having: a K-value defined as $$K = (3/\sqrt{2}) \cdot F \cdot S^{-3/2} \cdot R^{-1/2}$$

(wherein F and S represent a load value (kgf) and a compression displacement (mm) at 10% compression deformation of said adhesive coated spherical spacer, respectively, and R represents a radius (mm) of said adhesive coated spherical spacer) which is in the range of 250 kgf/mm² to 700 kgf/mm² at 20° C.; and a recovery factor after the compression deformation which is in the range of 30% to 80% at 20° C., wherein said fine sphere is made of divinylbenzene-tetramethylolmethane tetraacrylate copolymer.

* * * * *